(12) United States Patent
Mayer et al.

(10) Patent No.: US 10,332,361 B2
(45) Date of Patent: Jun. 25, 2019

(54) ADAPTOR FOR AFFIXING AN ELECTRONIC PAYMENT TERMINAL TO A SUPPORT

(71) Applicant: INGENICO GROUP, Paris (FR)

(72) Inventors: Laurent Mayer, Courdimanche (FR); Pierre Blot, Nantes (FR); Johann Balasse, Condrieu (FR)

(73) Assignee: INGENICO GROUP, Paris (FR)

( * ) Notice: Subject to any disclaimer, the term of this patent is extended or adjusted under 35 U.S.C. 154(b) by 0 days.

(21) Appl. No.: 15/995,920

(22) Filed: Jun. 1, 2018

(65) Prior Publication Data

US 2018/0350200 A1    Dec. 6, 2018

(30) Foreign Application Priority Data

Jun. 1, 2017   (FR) ...................... 17 54876

(51) Int. Cl.
| | | |
|---|---|---|
| G07G 1/00 | (2006.01) | |
| G07G 1/12 | (2006.01) | |
| H05K 7/14 | (2006.01) | |
| H05K 7/16 | (2006.01) | |
| F16M 11/04 | (2006.01) | |
| F16M 11/10 | (2006.01) | |

(52) U.S. Cl.
CPC ......... *G07G 1/0018* (2013.01); *F16M 11/041* (2013.01); *F16M 11/10* (2013.01); *G07G 1/12* (2013.01); *H05K 7/1401* (2013.01); *H05K 7/16* (2013.01)

(58) Field of Classification Search
None
See application file for complete search history.

(56) References Cited

U.S. PATENT DOCUMENTS

| 8,988,862 B2 | 3/2015 | Yuen |
| 2013/0044099 A1 | 2/2013 | Yuen |

FOREIGN PATENT DOCUMENTS

| EP | 2463746 A2 | 6/2012 |
| NL | 1012402 C2 | 12/2000 |
| WO | 2011111000 A1 | 9/2011 |

OTHER PUBLICATIONS

Preliminary Search Report dated Feb. 6, 2018 for corresponding French Patent Application No. 1754876, filed Jun. 1, 2017.
Written Opinion on the Patentability of the Invention dated Feb. 6, 2018 for corresponding French Patent Application No. 1754876, filed Jun. 1, 2017.

*Primary Examiner* — Kristy A Haupt
(74) *Attorney, Agent, or Firm* — David D. Brush; Westman, Champlin & Koehler, P.A.

(57) ABSTRACT

An adaptor for fixed attachment of an electronic payment terminal to a support. The adaptor has a body on which there is mounted a clip for the reversible fixed attachment of the electronic payment terminal to the support.

10 Claims, 3 Drawing Sheets

ADAPTOR FOR AFFIXING AN ELECTRONIC PAYMENT TERMINAL TO A SUPPORT

1. FIELD OF THE INVENTION

The field of the invention is that of electronic terminals.

More specifically, the invention relates to electronic payment terminals intended for use on fixed supports and for the fixed attachment of these terminals to these supports.

2. TECHNOLOGICAL BACKGROUND

We shall strive more particularly here below in this document to describe the problems and issues existing in the field of electronic payment terminals that have been faced by the inventors of the present patent application. The invention is of course not limited to this particular field of application but is of interest for all electronic terminals that have to cope with proximate or similar problems and issues.

There are known supports in the prior art such as mounting feet or masts to which electronic payment terminals are fixed. This type of device is often found in cash registers in stores.

Electronic payment terminals are fixedly attached to these supports by means of a system of screws that prevent the electronic payment terminal from getting loosened from the support and falling.

For reasons of security, it is preferable for the electronic payment terminals to be detached from their support and placed in a secured box when they are not in use, for example outside store opening times.

Thus, before a merchant opens his business establishment, he must fixedly attach each of the electronic payment terminals of his fleet to its respective support by means of a conventional tool (a screwdriver). Then, when he closes his business establishment, the merchant must detach the electronic payment terminals from their supports and place them in the secured box.

According to this prior-art technique, to carry out the payment operation, the merchant enters the amount of the transaction in the electronic payment terminal and then makes this terminal pivot towards the customer by rotating the support so that he can carry out the transaction in full confidentiality (by inserting his card and then entering his PIN code).

One drawback of this prior-art technique lies in the fact that the operations for fixedly attaching and detaching electronic payment terminals to and from their supports, which can be carried out several times a day, are time-consuming for the person who performs them.

In addition, the need to use to a tool, although it is a conventional one, complicates the installation and separation of the terminals and therefore also affects the time needed for performing these operations.

In other words, there is currently no simple and rapid system for fixedly attaching and detaching an electronic payment terminal to and from its support.

3. SUMMARY OF THE INVENTION

The invention proposes an adaptor for the reversible fixed attachment of an electronic payment terminal to a support.

According to the invention, the adaptor comprises a body on which there is mounted a clip for the reversible fixed attachment of the electronic payment terminal to the support.

Thus, the invention relies on a novel and inventive approach to the fixed attachment and detachment of an electronic payment terminal to and from a support (for example a mounting foot), by the implementing of an adaptor between the support and the electronic payment terminal, comprising a clip for fastening the electronic payment terminal to the support.

The use of such an adaptor enables a rapid installation/de-installation of the electronic payment terminal to and from its support by the merchant because, contrary to the prior art, the use of an affixing clip removes the need for using a tool to fixedly attach/detach the electronic payment terminal to and from the support.

Indeed, according to the prior-art techniques, electronic payment terminals are fixed to their support by means of at least one screw and a tool (a screwdriver) therefore needs to be used in order to fixedly attach and detach the electronic payment terminal to and from the support.

The fastening clip of the invention facilitates the installation and de-installation of the electronic payment terminal to its support since simple pressure on the part of the user on the clip enables the fixed attachment/detachment of the electronic payment terminal.

According to one particular aspect of the invention, the clip is mounted pivotingly on the body of the adaptor.

According to another particular aspect of the invention, the clip has a return element situated between the clip and the body.

Thus, the fixed attachment/detachment of the electronic payment terminal relative to the support is done by simple pressure on the part of the user on the clip, for example through the electronic payment terminal. This pressure must simply be greater than the return force of the return element.

According to one particular aspect of the invention, the return element takes the form of a spring.

According to another particular aspect of the invention, the body has at least one hole for the passage of the means for affixing the adaptor to the support.

The use of this hole enables the adaptor to be affixed to any support. For example, the affixing means take the form of two fastening screws that pass through two holes made in the adaptor and then cooperate with two tapped holes made on the support. These means for affixing the adaptor to the support are not accessible when the electronic payment terminal is fixedly attached to the adaptor, thus ensuring a high level of security.

According to one particular aspect of the invention, the body furthermore has at least two through holes situated on either side of a notch and intended for cooperating with locking means for locking the electronic payment terminal to the adaptor.

Thus, the adaptor has means for receiving locking means that can be used, if the merchant wishes it, to lock the electronic payment terminal to the adaptor in order to provide security greater than that obtained by simply clipping the electronic payment terminal onto the adaptor.

According to one particular aspect of the invention, the through holes are meant to cooperate with means for affixing an intermediate locking element forming the locking means and the notch is configured to cooperate with a locking pin of the intermediate locking element.

Thus, locking means, for example a Kensington® type lock, can be affixed to the adaptor by means of through holes. The notch made between the through holes thus enables the passage of a locking pin, for example the pin of the Kensington® lock which then cooperates with a suitable aperture made in the shell of the electronic payment terminal.

The intermediate element can be unlocked only by a specific tool, and this improves/augments the security of the electronic payment terminal when it is fixedly attached to the support by means of the adaptor of the invention. In addition, through the adaptor of the invention, it is no longer necessary to implement any additional locking cable since the intermediate element is directly affixed to the adaptor. The securing of the electronic payment terminal is therefore increased in a relatively simple way.

According to one particular aspect of the invention, the notch is configured to cooperate with a screw forming the locking means.

Thus, one variant of the locking means consists in implementing a locking screw. Such a locking screw also improves/augments the security of the electronic payment terminal when it is fixedly attached to the support. However, the level of security of such a locking screw is lower than the level of security provided by the intermediate element since, in this case, a classic tool (a screwdriver) can be used to unlock the electronic payment terminal.

Thus, the adaptor of the invention provides its user with three levels of security, namely:
- a first level of securing in which the electronic payment terminal is fixedly attached to the support only by the fixed-attachment clip;
- an intermediate level of securing in which the electronic payment terminal is fixedly attached to the support by the fixed-attachment clip and secured by a locking screw; and
- a high level of securing in which the electronic payment terminal is fixedly attached to the support by the fixed-attachment clip and secured by an intermediate locking element (a Kensington® type lock for example).

The invention also proposes an electronic payment terminal configured to cooperate with an adaptor as described here above.

According to the invention, the electronic payment terminal comprises a rear cover having a housing adapted for receiving the adaptor.

Thus, the rear cover of the electronic payment terminal has a housing adapted to the shape of the body of the adaptor to receive this adaptor and to allow only one degree of freedom to the unit formed by the adaptor and the rear cover. The only degree of freedom allowed to the unit is the one that enables the insertion and removal of the electronic payment terminal when the fixed-attachment clip allows it.

According to one particular aspect of the invention, the housing has a groove for inserting and for stopping the clip for the fixed attachment of the adaptor.

According to this particular aspect, the groove present in the housing enables the fixed-attachment clip to be received and maintained so as to eliminate the last degree of freedom of the assembly formed by the adaptor and the rear cover to prevent the removal of the electronic payment terminal from the adaptor.

According to one particular aspect of the invention, in the vicinity of the housing, the rear cover has a blind hole that is meant to cooperate with means for locking the electronic payment terminal to the adaptor.

According to this particular aspect, the blind hole made in the rear cover of the electronic payment terminal is capable of cooperating either with the locking screw or with the locking pin of the intermediate element which for example takes the form of a Kensington® lock. It must be noted that it is not possible to implement both the locking screw and the intermediate element.

Thus, the use of this blind hole makes it possible, through the locking means, to secure the electronic payment terminal.

4. LIST OF FIGURES

Other features and advantages of the invention shall appear from the following description, given by way of a non-exhaustive indicatory example, and from the appended figures, of which:

5. DETAILED DESCRIPTION

The principle of the invention relies on the implementing of an adaptor comprising an affixing fastening clip in order to obtain, in a simple and reversible way, the fixed attachment of an electronic payment terminal to a support (for example to a supporting foot).

5.1 Description of a First Embodiment of the Invention

Figure 1:
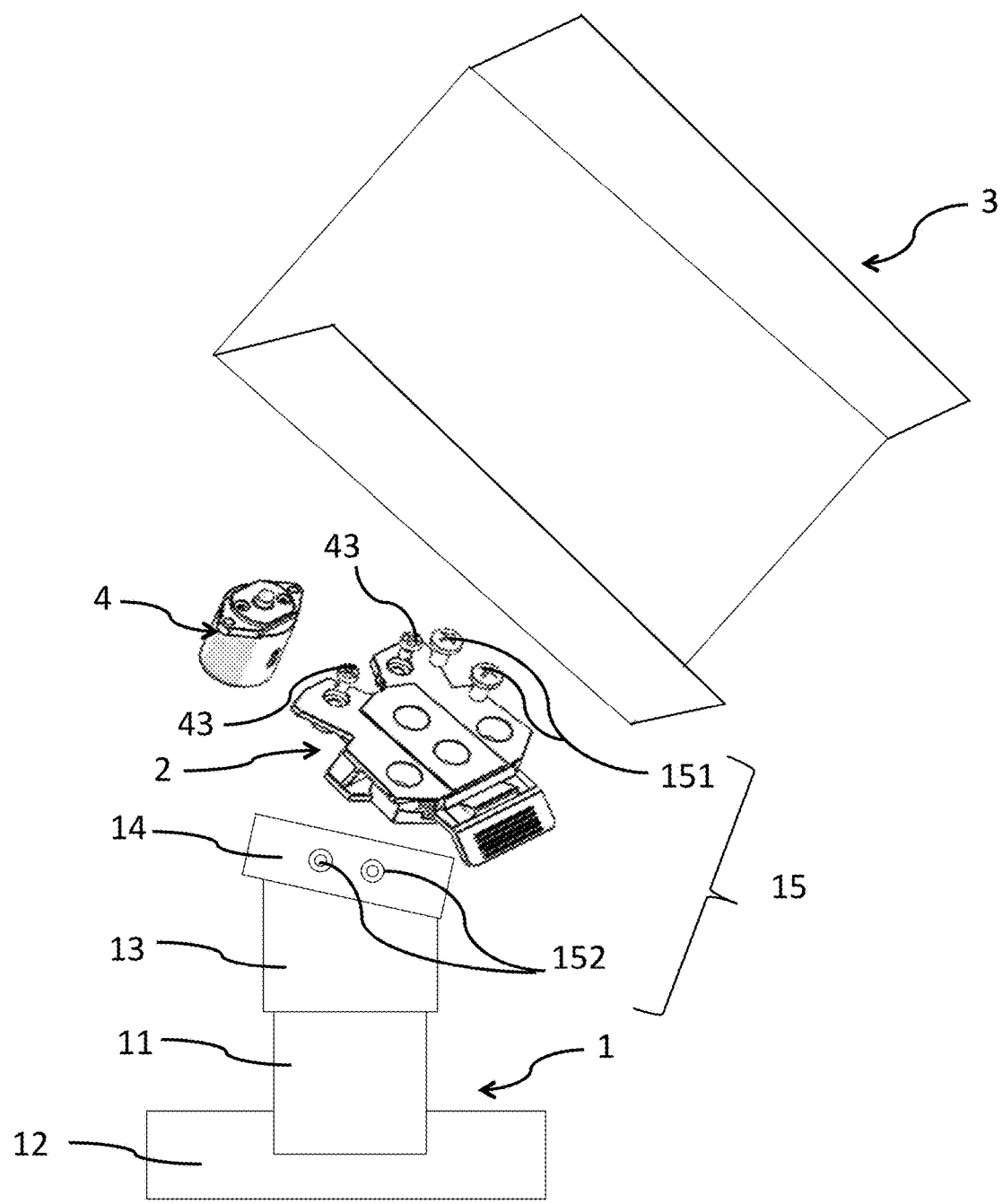
FIG. 1 is an exploded view of the different elements, and especially of an adaptor enabling the affixing of an electronic payment terminal to a support, according to one embodiment of the invention.
Figure 2:
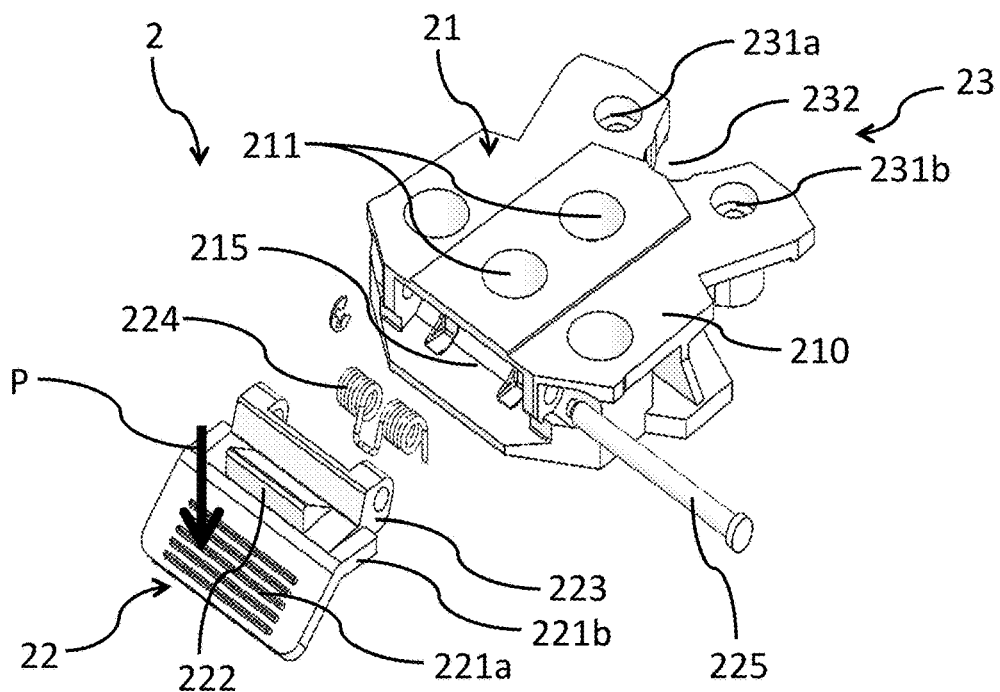
FIG. 2 is an exploded view of an adaptor according to one embodiment of the invention.

Referring now to FIGS. 1 and 2, we present a technique for fastening an electronic payment terminal to a support, implementing an adaptor according to a first embodiment of the invention.

More specifically, this affixing technique implements an adaptor 2 by means of which an electronic payment terminal can be fixedly attached to a support 1.

Optionally, locking means 4 can be planned in addition to the adaptor 2 in order to secure the affixing of the electronic payment terminal to the support 1. These locking means are described in greater detail in the description of the following embodiments.

The support 1, to which the electronic payment terminal can be fixedly attached, takes the form in this example of a mounting or affixing foot. There are numerous examples of supports for electronic payment terminals through which this electronic payment terminal can be kept in a position that makes it easy to use, whether for the merchant or for the customer.

According to the example illustrated in FIGS. 1 and 2, the support 1 has a base 12 that is meant to be solidly fixed to the office furnishings of a business establishment for example. A fixed part 11 is fixedly attached, at a first extremity, to the base 12 and is extended, at a second extremity, by a pivoting part 13 that is rotationally mobile relative to the fixed part 11 along a vertical axis. In this way, the electronic payment terminal fixed to this support 1 can take several positions, especially during a transaction. Thus, the electronic payment terminal can be oriented so as to be facing the merchant when he enters the amount of the transaction for example and then oriented towards the customer when he inserts his payment card and then enters his PIN code for example.

The pivoting part 13 comprises a rotating head 14 capable of pivoting about a horizontal axis. This pivoting is useful especially to orient the electronic payment terminal more or less horizontally in order to facilitate access to the keys for the entry of the PIN code.

The rotating head 14 comprises affixing means 15 for affixing the adaptor 2 to the support 1. In the example illustrated in FIG. 1, the affixing means 15 take the form of two affixing screws 151 that pass through holes 211 made in the adaptor 2 which then cooperate with the tapped holes 152 made in the rotating head 14.

FIG. 2 illustrates an exploded view of the adaptor 2 according to this first embodiment of the invention. The adaptor 2 comprises a body 1 that has a complex shape, for example a general rectangular shape having chamfered corners. It will be understood of course that any other body shape can be proposed to resolve the technical problem without departing from the general principle of the invention.

Figures 4A, 4B:
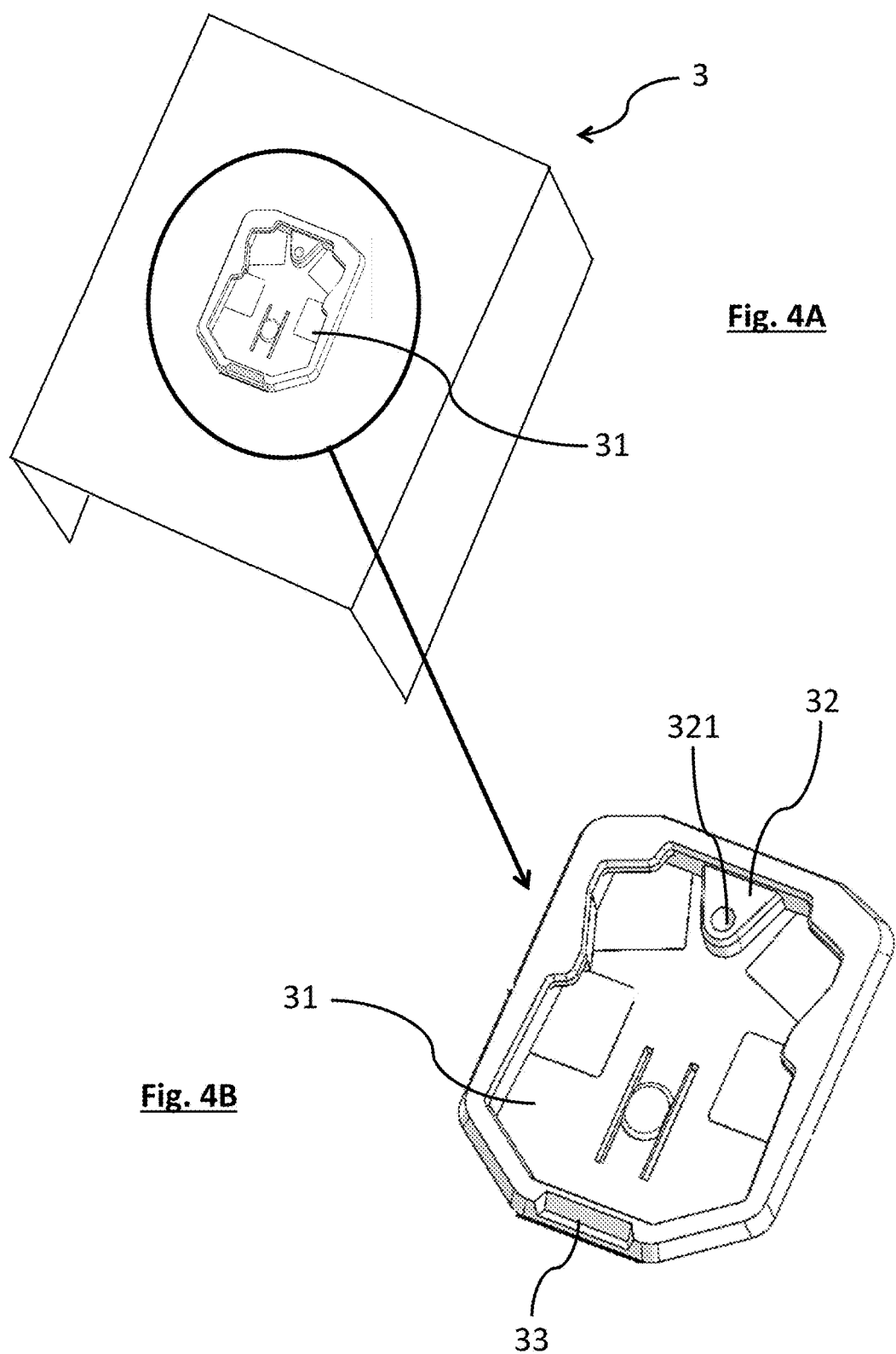
FIG. 4A is a view in perspective (or three-quarter view) of the rear cover of an electronic payment terminal configured to cooperate with the adaptor of FIG. 2.
FIG. 4B is a detailed view of the rear cover of a terminal of FIG. 4A.

The body 21 of the adaptor 2 has a lower surface (not visible in the figures) that is meant to get supported against the rotating head 14 of the support 1 and an upper surface 210 meant to cooperate with the rear cover 3 of the electronic payment terminal (illustrated in FIGS. 4A and 4B).

The body comprises, appreciably at its center, two through holes 211 for the passage of the affixing screws 151 that enable the adaptor 2 to be affixed to the rotating head 14 of the support 1.

According to this embodiment of the invention, the adaptor 2 comprises a fixed-attachment clip 22 that is used to command the fixed attachment and detachment of the electronic payment terminal to and from the support 1.

The clip 22 has a pressure surface or support surface 221a that is tilted and extended by a rectilinear surface 221b.

The rectilinear surface 221b comprises a holding stud 222 and an affixation base 223. The holding stud 222 projects out of the rectilinear surface 221b and has an appreciably triangular shape. The affixation base 223 of the clip 22 has a circular aperture at each of its ends.

The clip 22 is intended to be fixedly attached to the body 21 of the adaptor 2. To this end, the body 21 comprises a housing 215 made between the lower and upper surfaces 210. The housing 215 is configured to receive the affixation base 223 of the clip 22 and, like the affixation base 222, it has two circular apertures.

Thus, an affixation rod 225, that passes through the apertures of the affixation base 223 and those of the housing 215, is used to fixedly attach the affixation base 223 of the clip 22 to the body 21 while enabling the clip 22 to pivot relative to the body 21.

A return element 224, in this example taking the form of a spring, is disposed in the housing 215 between the fixed-attachment clip 22 and the body 21. Such a return element 224 makes it possible, when a user exerts pressure on the supporting surface 221 of the clip and then relaxes it, to recall the clip 22 into a position called a nominal or resting position.

When fixedly attaching the electronic payment terminal to the adaptor 2, the user holds the payment terminal in his hand and places it in contact against the adaptor 2. By pressing on the payment terminal, the user exerts pressure which is exerted in a vertical direction and then downwards as indicated by the arrow "P" illustrated in FIG. 2. The return element 224 is then in a compressed position (not shown). When pressure by the user on the payment terminal, and therefore on the clip 22, is no longer maintained, the return element 224 brings the clip 22 back into its normal position (the one illustrated in FIGS. 1 and 2).

This implementation of the different elements forming the adaptor 2 according to this embodiment thus enables the electronic payment terminal to be affixed to a support 1 easily and without tools. Indeed, as indicated here above, a simple pressure by the user on the payment terminal when this terminal is in contact with the adaptor 2 shifts the fixed-attachment clip 22 and enables the electronic payment terminal to be positioned on the body 21 of the adaptor 2, the electronic payment terminal being held on the adaptor when the pressure by the user is relaxed. In the same way, if the user (for example the merchant) wishes to separate the electronic payment terminal from the support 1, he exerts pressure directly on the clip 22 of the adaptor 2, enabling the electronic payment terminal to be released from the body 21 of the adaptor 22.

The adaptor 2 further comprises, on one edge of its upper surface 210 (the upper edge of the body 21 as illustrated in FIG. 2), means 23 for receiving locking means 4 for locking the electronic payment terminal to the adaptor 2.

The reception means 23 comprise two through holes 231a, 231b situated on either side of a notch 232. The implementing of the reception means 23 for receiving the locking means 4 for locking the electronic payment terminal to the adaptor 2 shall be described in greater detail with reference to the other embodiments of the invention.

As illustrated in FIGS. 4A and 4B, the rear cover 3 of an electronic payment terminal is adapted to cooperating with the adaptor 2. More specifically, the rear cover 3 has a housing or recess 31 with a shape corresponding to the shape of the upper surface 210 of the body 21 of the adaptor 2.

Thus, the body 21 of the adaptor 2 is received in the housing 31 of the rear cover 3 in order to maintain the electronic payment terminal on the adaptor (which is itself fixed to the support 1 for example). The corresponding shapes of the body 21 and of the housing 21 make it possible to leave the assembly with only one degree of freedom, the one that enables the insertion and removal of the body 21 of the adaptor 2 into and out of the housing 31 in the rear cover 3 of the electronic payment terminal.

According to this embodiment, the housing 31 comprises, in the vicinity of one of its edges (for example the upper edge illustrated in FIG. 4B), a protrusion 32 intended for cooperating with the notch 232 of the adaptor 2 when the adaptor 2 is fixedly attached to the rear cover 3.

The protrusion 32 has a blind hole 321 capable of cooperating with the locking means 4 for locking the electronic payment terminal to the support 1, via the adaptor 2 (described in the following embodiments).

The rear cover 3 furthermore comprises a groove 33 in the vicinity of another edge of the housing 31 (the lower edge in FIG. 4B). This groove 33 is to cooperate with the holding stud 222 of the fixed-attachment clip 22, thus enabling the electronic payment terminal to be maintained on the adaptor 2.

The fixed attachment of an electronic payment terminal to the support 1 is therefore very simple.

Indeed, after having definitively fixed the adaptor 2 to the mounting foot 1 (by means of the affixing screws 151 for example), it is enough to clip the electronic payment terminal to the adaptor 2. This operation requires no additional action on the part of the user since, when the terminal is brought into contact against the adaptor 2 by the user, the groove 33 of the rear cover 3 guides the holding stud 222 of the clip 22 and compresses the return element 224. Thus, the adaptor 2 can be inserted into the housing 31 of the rear cover 3 and held in this cover by interaction between the holding stud 222 and the groove 33.

In one variant, the fixed attachment of the payment terminal to the adaptor 2 can necessitate a pressure by the user on the pressure surface 221*a* of the clip 2 in order to shift the return element 224 into its compressed position, thus enabling the insertion of the body 21 in the housing 31 of the rear cover 3.

The electronic payment terminal can be detached also by simple pressure P by the user on the pressure surface of the clip 22 to compress the return element 224 and enable the removal of the adaptor 2 from the housing 31 of the rear cover 3.

Thus, the fixed attachment and detachment of the electronic payment terminal to and from the support are simple and rapid. In addition, these operations require no tool whether classic or specific.

5.2 Description of a Second Embodiment of the Invention

Figure 3:
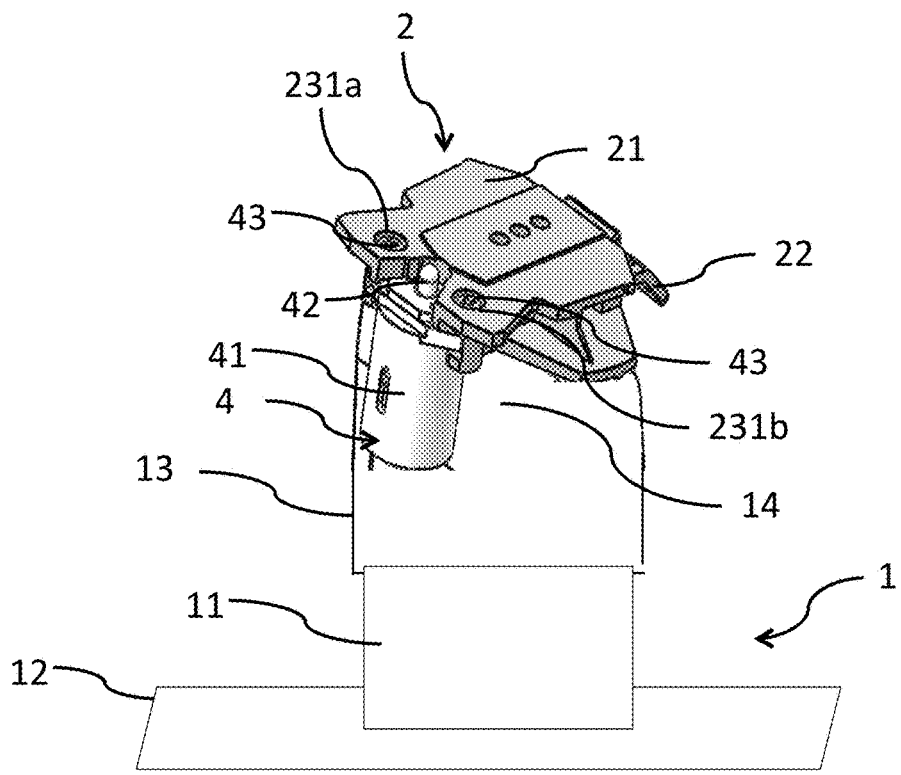
FIG. 3 is a view in perspective (or three-quarter view) of an adaptor affixed to a support according to one embodiment of the invention.

In a second particular embodiment of the invention, illustrated in FIG. 3, it is possible, optionally, to implement locking means 4 (for locking the electronic payment terminal to the support 1 through the adaptor 2) that take the form of an intermediate locking element 41.

In the example illustrated, the intermediate locking element 41 takes the form of a Kensington® type lock (registered mark). This type of lock 41 is well known for securing electronic devices such as computers for example.

Here, the Kensington® lock is adapted to being fixed directly (and not via a cable) to the adaptor 2 by means of two affixing screws 43 that cooperate respectively with the through holes 231*a* and 231*b* of the adaptor 2.

A locking pin 42 of the intermediate element 41 projects from the upper surface of the intermediate element 41 (as illustrated in FIG. 3) and thus gets in the notch 232 provided in the body 21 of the adaptor.

The locking pin 42 is thus adapted to cooperating with the blind hole 321 of the rear cover 3 of the electronic payment terminal in order to lock this terminal to the adaptor 2 and thus secure the affixing of the electronic payment terminal.

The locking and unlocking of the intermediate element 41 is carried out conventionally and in a known way by means of a specific tool such as a spanner.

The implementing of such an intermediate element 41 removes the need for using a locking cable and thus makes it easier to secure the affixation of the electronic payment terminal.

It must be noted that the intermediate locking element 41 complements the clip 22 for the fixed attachment of the electronic payment terminal to the support 1. Thus, the intermediate locking element 41 brings an optional security level that is additional to the use of the clip 22 alone.

5.3 Description of a Third Embodiment of the Invention

In a third particular embodiment of the invention (not shown), also optionally, it is possible to use locking means 4 that take the form of a locking screw.

Such a locking screw is intended to secure the affixing of the electronic payment terminal to the support 1.

To this end, an intermediate part is mounted on the body 21 of the adaptor 2 and is held on this adaptor 2 by two holding screws cooperating with the through holes 231*a* and 231*b* of the adaptor 2.

The intermediate part comprises a tapped hole that is intended to receive the locking screw. More specifically, the head of the locking screw comes into contact against the lower surface of the intermediate part and the threaded rod of the locking screw extends through the tapped hole until it cooperates with the blind hole 321 of the rear cover 3 of the electronic payment terminal in order to lock and thus secure the affixing of the electronic payment terminal to the adaptor 2 and therefore to the support 1.

As in the case of the intermediate locking element 41, the locking screw acts as a complement to the clip 22 for the fixed attachment of the electronic payment terminal to the support 1. Thus, this locking screw adds a level of security additional to that provided by the use of the clip 22 alone.

However, the locking/unlocking of the terminal requires a screwdriver, therefore a classic tool. The level of security added by the locking screw therefore offers an intermediate level of securing of the affixing of the electronic payment terminal to the support, between the fixed-attachment clip 22 alone (first level of securing) and the combination of the fixed-attachment clip 22 and the intermediate element 41 (high level of securing because it requires a specific tool).

5.4 Other Aspects and Variants

The adaptor 2 of the invention according to the different embodiments described here above can take three levels of security, namely:
- a first level of security when the electronic payment terminal is fixedly attached by the clip 22 alone;
- a second level of security, called an intermediate level, when the electronic payment terminal is fixedly attached by the clip 22 and secured by the locking screw; and
- a third level of security, called a high level, when the electronic payment terminal is fixedly attached by the clip 22 and secured by the intermediate element 41.

The adaptor 2 of the invention can also be implemented for wireless electronic payment terminals that are detached from their support (the charging cradle for example) so that the customer can make the transaction in full confidentiality (insertion of his card plus entry of his PIN code).

The invention claimed is:

1. An adapter for reversible fixed attachment of an electronic payment terminal to a support, wherein the adaptor comprises:
    a body fixable to said support; and
    a clip mounted on the body and providing the reversible fixed attachment of said electronic payment terminal to said support, wherein the clip is arranged to detach said electronic payment terminal from said support by pressure applied by a user on said clip, and said clip is mounted pivotingly on said body of said adaptor and said clip has a return element situated between said clip and said body.

2. The adapter according to claim 1, wherein said return element takes the form of a spring.

3. The adapter according to claim 1, wherein said body has at least one hole for passage of an affixing element to affix said adaptor to said support.

4. The adapter according to claim 1, wherein said body further has at least two through holes situated on either side of a notch and intended for cooperating with a lock, which locks said electronic payment terminal to said adaptor.

5. The adapter according to claim 4, wherein said through holes cooperate with an affixing element affixing an intermediate locking element forming said lock and said notch cooperates with a locking pin of said intermediate locking element.

6. The adapter according to claim 4, wherein said notch cooperates with a screw forming said lock.

7. An electronic payment terminal configured to cooperate with an adaptor according to claim 1, wherein the terminal comprises a rear cover having a housing adapted for receiving said adaptor.

8. The electronic payment terminal according to claim 7, wherein the housing has a groove for insertion and stopping of said clip for the fixed attachment of said adaptor.

9. The electronic payment terminal according to claim 7 wherein, in the vicinity of said housing, said rear cover has a blind hole that cooperates with a lock for locking said electronic payment terminal to said adaptor.

10. An adapter for reversible fixed attachment of an electronic payment terminal to a support, wherein the adaptor comprises:
   a body fixable to said support and comprising at least two through holes situated on either side of a notch and intended for cooperating with a lock, which locks said electronic payment terminal to said adaptor, wherein said through holes cooperate with an affixing element affixing an intermediate locking element forming said lock and said notch cooperates with a locking pin of said intermediate locking element; and
   a clip mounted on the body and providing the reversible fixed attachment of said electronic payment terminal to said support, wherein the clip is arranged to detach said electronic payment terminal from said support by pressure applied by a user on said clip.

* * * * *